ical Patent [19]

Tanaka et al.

[11] Patent Number: 4,926,070
[45] Date of Patent: May 15, 1990

[54] VOLTAGE LEVEL CONVERTING CIRCUIT
[75] Inventors: Sumio Tanaka; Shigeru Atsumi, both of Tokyo, Japan
[73] Assignee: Kabushiki Kaisha Toshiba, Kanagawa, Japan
[21] Appl. No.: 291,933
[22] Filed: Dec. 30, 1988
[30] Foreign Application Priority Data
  Feb. 22, 1988 [JP] Japan .................................. 63-39294
[51] Int. Cl.[5] .................. H03K 19/094; H03K 19/092
[52] U.S. Cl. ...................................... 307/475; 307/451; 307/550
[58] Field of Search ............... 307/443, 448, 451, 263, 307/542, 550, 475

[56]         References Cited
        U.S. PATENT DOCUMENTS

| 4,384,216 | 5/1983 | Pricer ................................ 307/263 |
| 4,506,164 | 3/1985 | Higuchi .............................. 307/264 |
| 4,672,243 | 6/1987 | Kirsch ............................... 307/475 |

FOREIGN PATENT DOCUMENTS
59-90292  5/1984  Japan .

OTHER PUBLICATIONS
A Programmable 256K CMOS EPROM with On-Chip Test Circuits, by Tanaka et al, 1984 IEEE International Solid-State Circuits Conference, pp. 148 and 149.
Fast Programmable 256K Read Only Memory with On-Chip Test Circuits, Shigeru Atsumi et al, IEEE Journal of Solid-State Circuits, vol. SC-20, No. 1, Feb. 1985, pp. 422–427.

Primary Examiner—Stanley D. Miller
Assistant Examiner—Margaret Rose Wambach
Attorney, Agent, or Firm—Finnegan, Henderson, Farabow, Garrett and Dunner

[57]         ABSTRACT

A voltage level converting circuit for outputting an output signal of a write voltage level responsive to a read voltage level input signal comprises an inverter circuit biased with a power supply of the first voltage level. The input signal is supplied through a transfer gate circuit. A MOS transistor is provided between the input of the inverter circuit and a power supply of the write voltage level to pull-up the voltage level of the input to the inverter circuit responsive to the output of the inverter circuit. Another MOS transistor is provided between the output of the inverter circuit and ground to pull-down the output voltage level responsive to the input signal.

6 Claims, 2 Drawing Sheets

VOLTAGE LEVEL CONVERTING CIRCUIT

BACKGROUND OF THE INVENTION

1. Field of the Invention

This invention concerns a voltage level converting circuit, and more particularly a voltage level converting circuit for converting a read level voltage to a write level voltage, and being installed in a nonvolatile memory, such as EPROM and EEPROM, etc.

2. Description of the Prior Art

Both the EPROM (Erasable Programmable Read Only Memory) and the EEPROM (Electrical Erasable Programmable Read Only Memory) retain data even if their power source supply is cut off. The data in the EPROM may be erased by ultra violet rays, and the data in the EEPROM may be erased electricallY, and both can be rewritten with new data.

FIG. 1 is a block diagram of a conventional EPROM. In FIG. 1, numeral 11 designates a control circuit for selectively outputting a read level voltage VCC, e.g., +5 volt, or a write level voltage VPP, e.g., +12.5 volt. Numeral 13 designates a voltage level converting circuit for converting a write enable signal WE of the read level voltage VCC, which is supplied to an input terminal 10, to a write level voltage VPP. A depletion type MOS transistor 12 is biased with the write level vOltage VPP, and supplied with an output signal of the voltage level converting circuit 13. Another depletion tYpe MOS transistor 14 is biased with the read level voltage VCC, and supplied with the WE signal through two inverters 15 and 16, at the gate electrode thereof. The output of the transistors 12 and 14 are supplied to a column decoder 17 and a row decoder 18.

Numeral 19 shows a data-write control circuit, which includes a voltage level converting circuit 20 for converting a write-data D of the read level voltage, which is supplied to a terminal 9, to the write level voltage. The control circuit 19 further includes an enhancement MOS transistor 21 being supplied the output of the voltage level converting circuit 20. The MOS transistor 21 acts as a load during a write operation, and supplies the write level voltage VPP to a column gating circuit 22, in response to the output signal of the voltage level converting circuit 20. The column gating circuit 22 is provided with a sense amplifier 23.

The output of the column decoder 17 is selectively supplied to corresponding gate transistOr 25, to select bit line 24. On the other hand, an output of row decoder 18 is selectively connected to control gate electrodes of nonvolatile MOS transistors in a memory cell arraY 27.

In this construction, a write operation is performed by selecting a memory transistor, e.g., a transistor 28, by setting one of the output signals of the column decoder 17 and the row decoder 18 corresponding to the transistor 28 to the write level voltage VPP. Namely, at first, the write enable signal WE is set to "O" level to obtain an output signal of a write level voltage corresponding to a "1" level from the voltage level converting circuit 13. In this condition, the transistor 12 supplied with the signal of "1" level, changes to the conductive state to supply the write level voltage VPP to the column decoder 17 and the row decoder 18. The column decoder 17 and the row decoder 18 output an output signal of the write voltage level in response to an address signal (not shown), respectively. In accordance with the output signal of the column decoder 17, for example, a gate transistor 25 is rendered conductive, and a bit line 24 is selected.

In this way, a transistor 28, which is positioned at the cross point of the selected bit line 24 and word line 26 is selected. In this state, in the case where the write-data D is "0" level, data is written into the transistor 28, since the transistor 21 is conductive because it is supplied with the level converted output signal of the VPP level from the voltage level converting circuit 20.

FIG. 2 is a circuit diagram of a conventional voltage level converting circuit used as the voltage level converting circuits 13 and 20, in FIG. 1. An input signal Sin having the read level voltage VCC corresponding to the logical "1" level thereof is supplied to a terminal 36, and is transferred to the gate electrodes of a P-type MOS transistOr 33 and an N-type MOS transistor 34 through inverters 29, 30, and transfer gate transistors 31 and 32. The inverters 29 and 30 are biased with the VCC voltage and the ground level voltage VSS. Thus, the signal at the node A swings between the voltage level VCC and ground level VSS, namely 0 volt.

The transfer gate transistor 31 acts to transfer the VCC level signal to the node B, and to prevent the transfer of the VPP level at the node B to the node A. The transfer gate transistor 32 becomes nonconductive when the gate voltage VPP is "0" level, and prevents a formation of a conductive path between the node A and the node B when the VPP is 0 volt. The drain electrode of the transistors 33 and 34 are connected in common, and connected to an output terminal 37 to output an output signal OUT.

The output signal OUT is supplied to the gate electrode of a P-type MOS transistor 35, which is connected between the write level voltage VPP and the node B. The gate electrode of the transfer gate transistor 31 is supplied with the read level voltage VCC, and the gate electrode of the transistor 32 is supplied with the write level voltage VPP. The source electrode of the transistor 33 is suppled with the write level voltage VPP, and the source electrode of the transistor 34 is connected to around level VSS.

In this circuit, when the input signal Sin changes to "1" level, namely the VCC level, the signal at the node A changes to "1" level, namely the VCC level. Thus, the transistor 33 changes to a non-conductive state, and the transistor 34 changes to a conductive state, to provide the output signal OUT at a "0" level. In this state, the P-type MOS transistor 35 is supplied with the "0" level output signal OUT at the gate electrode thereof. Thus, the transistor 35 changes to a conductive state to supply the write level voltage VPP to the node B, to speed up the change of the transistor 34 to the conductive state.

On the other hand, when the input signal Sin changes to "0" level, the transistor 33 changes to a conductive state, and the transistor 34 changes to a non-conductive state to get an output signal OUT of "1" level. In this state, the transistor 35 changes to a non-conductive state as being supplied with the high level signal at the gate electrode thereof.

However, in this construction, the voltage level present at node B occasionally becomes insufficient to make the transistor 34 conductive due to the voltage drop at the transfer gate transistors 31 and 32, even if the input signal Sin is at level "1".

FIG. 3 is a circuit diagram of another conventional voltage level converting circuit designed to improve the above described defect of the circuit of FIG. 2.

In this circuit, the gate electrode of the transistor 34 is directly connected to node A to eliminate the voltage drop due to the transfer gate transistors 31 and 32.

However, in this construction, there is another problem. Namely, in the case where an ESD (Electro Static Discharge) is supplied to a terminal for the write level voltage VPP during a time when no power is supplied to VPP and VCC, and the node A is in an imaginary grounding state, the surge voltage is supplied to the output terminal 37, since the transistor 34 is non-conductive and the transistor 33 is conductive. As a result, the control gate and the drain of the memory cell transistor in FIG. 1 becomes high level. Therefore, a stress is applied to the memory cell transistor to inject the charge into a floating gate, or to perform an unintentional writing. Thus, data in the memory may be disturbed.

SUMMARY OF THE INVENTION

Therefore, an object of this invention is to provide an improved voltage level converting circuit, which is free from the unintentional output due to the surge voltage, during the non-operative state.

To achieve the object this invention provides a voltage level converting circuit which receives an input logic signal of either a "one" or "zero" level, wherein the logic "one" signal is represented by a first voltage level, and output a logic signal of either a "zero" or "one" respectively, wherein the output logic "one" signal is represented by a second voltage level higher than said first voltage level, comprising: gate means for receiving and transferring the input signal: inverter means biased with a voltage of said second voltage level for receiving the input signal from said gate means and for outputting the output signal responsive to the input signal: pull-up means responsive to a "zero" output signal for raising the voltage level of the input signal to the inverter means; and pull-down means responsive to a "one" input signal for lowering the voltage level of the output signal.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings.

DETAILED DESCRIPTION OF THE INVENTION

Figure 4:
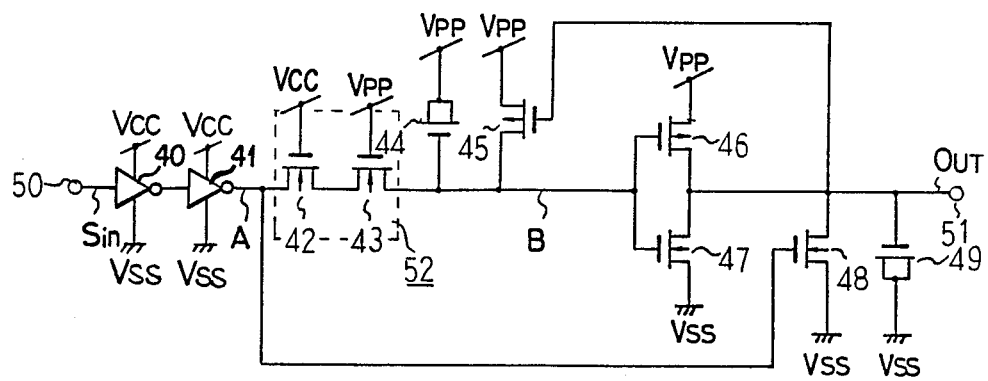
FIG. 4 is a circuit diagram of a preferred embodiment of this invention.

Referring now to FIG. 4, there is illustrated a circuit diagram of a preferred embodiment of this invention. An input signal Sin of a read level voltage, e.g, +5 volt, is supplied to a terminal 50, and supplied to a node A through two inverters 40 and 41. The inverters 40 and 41 are CMOS inverter circuits, and biased with the read level voltage VCC and ground level VSS.

In the present invention, there is gate means for receiving the input signal, and transferring it. In the preferred embodiment of FIG. 4, the gate means is 52. The gate means 52 includes N-type MOS transistors 42 and 43 connected in series with respect to the input signal Sin and a node B. The gate electrode of the MOS transistor 42 is supplied with a read level voltage VCC, e.g., +5 volt, and the gate electrode of the MOS transistor 43 is supplied with a write level voltage VPP, e.g., +12.5 volt.

In the present invention, there is also provided an inverter means. In the preferred embodiment of FIG. 4, the inverter means is a CMOS inverter circuit which includes a P-type MOS transistor 46 and an N-type MOS transistor 47. The gate electrodes of the transistors 46 and 47 are connected in common to the node B. The source electrode of the transistor 46 is supplied with a write level voltage VPP, and the source electrode of the transistor 47 is supplied with a ground level voltage VSS. The drain electrodes of the transistors 46 and 47 are connected in common to an output terminal 51.

In the present invention, there is also provided a pull-up means increasing the level of the signal supplied to the inverter means. In the preferred embodiment of FIG. 4, the pull-up means includes a P-type MOS transistor 45 and a MOS capacitor 44. The source electrode of the MOS transistor 45 is supplied with the write level voltage VPP, and the drain electrode thereof is connected to the node B. The gate electrode of the transistor 45 is supplied with the output signal OUT. The MOS capacitor 44 is constructed by connecting the source and drain electrodes in common. The common connection of the source and the drain electrodes is supplied with the write level voltage VPP, and the gate electrode thereof is connected to the node B.

In the present invention, there is also provided a pull-down means for lowering the voltage level of the output signal responsive to the input signal. In the preferred embodiment of FIG. 4, the pull-down means includes an N-type MOS transistor 48 and a MOS capacitor 49. The source electrode of the transistor 48 is supplied with the ground level voltage VSS, and the drain electrode thereof is connected to the output terminal 51. The gate electrode of the transistor 48 is connected to the node A.

The MOS capacitor 49 is constructed by connecting the source and drain electrodes of a MOS transistor in common. The common connection of the source and the drain electrodes is supplied with ground level voltage VSS, and the gate electrode thereof is connected to the output terminal 51.

In this construction, when the input signal Sin changes to "1" level, the signal at the node A becomes level "1" of the read level voltage VCC. As the gate electrode of the N-type MOS transistor 48 is directly connected to the node A, the transistor 48 changes to a conductive state to pull-down the voltage level of the output OUT, even if the voltage level at the node B is insufficient to make transistor 47 conductive due to the voltage drop of the transfer gate transistors 42 and 43. Thus, the voltage level at the output terminal 51 becomes "0" level. Furthermore, because the P-type MOS transistor 45 is supplied with the output signal OUT and is made conductive, it acts to pull-up the voltage level at the node B and thus the change of the MOS transistor 47 to the conductive state is speeded-up.

On the other hand, when the input signal Sin changes to "0" level, the P-type MOS transistor 46 changes to the conductive state, and the N-type MOS transistors 47 and 48 change to a non-conductive state. Thus, the output signal OUT becomes "1" level by being supplied with the write level voltage VPP via the conductive transistor 46. In this state, the p-type MOS transistor 45 supplied with the "1" level output signal OUT at the gate electrode thereof changes to a non-conductive state. Thus, as the node B is separated from the write level voltage VPP, the stitching of the transistor 46 to the conductive state is enhanced. Therefore, the level of the output signal OUT rapidly becomes a "1" level, namely the write level voltage VPP.

In this way, the read level voltage signal Sin is converted to a write level voltage signal OUT, at the normal operation state.

Next, the operation of the circuit when a surge voltage is supplied to the write level voltage terminal will be explained. In the state when no power supply voltage VPP and VCC are supplied to the circuit, the node A is in an imaginary grounded state. Thus, the N-type MOS transistor 48 is non-conductive. Furthermore, the transfer gate transistor 42 is non-conductive, since no gate voltage is applied to the gate electrode thereof. In this condition, the surge at the write level voltage VPP terminal can be transmitted to the output terminal 51 through the transistor 46. However, the surge voltage appearing at node B makes the N-type MOS transistor 47 conductive. Thus, the surge voltage to the output terminal 51 is shunted by the transistor 47 to around. Therefore, no surge voltage appears on the output terminal 51.

The MOS capacitor 44 acts to raise or pull-up the voltage level of the node B high, by transferring the surge voltage to the node B. On the other hand, the MOS capacitor 49 acts to lower or to pull-down the voltage level of the output terminal 51 by coupling the ground voltage level VSS to the output terminal 51. Thus, the Operation of the circuit is speeded up.

In this way, the transfer of the surge voltage at the write level voltage terminal is prevented.

Figure 1:
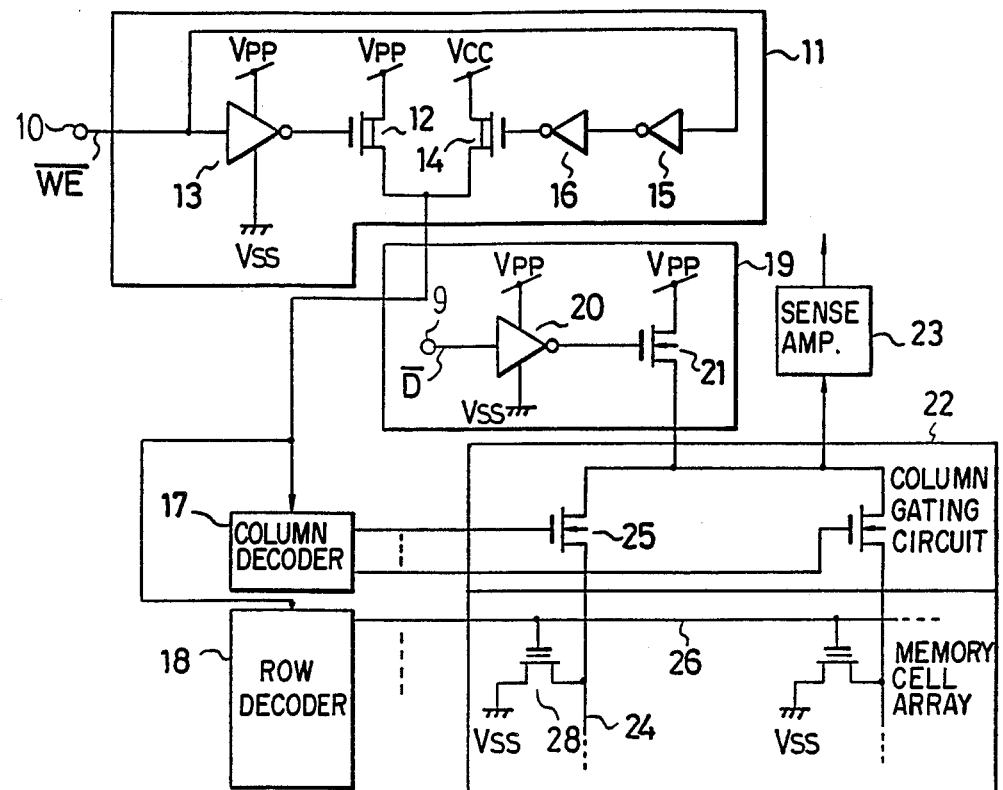
FIG. 1 is a circuit diagram of a conventional EPROM circuit.
Figure 2:
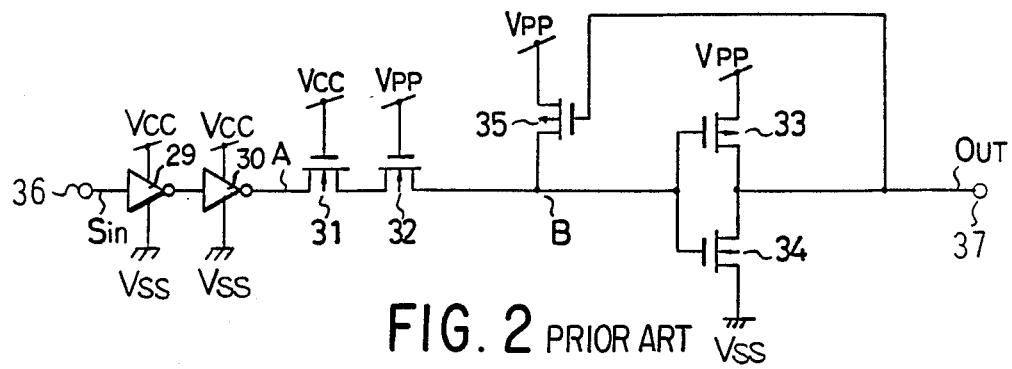
FIG. 2 is a circuit diagram of a conventional voltage level converting circuit.
Figure 3:
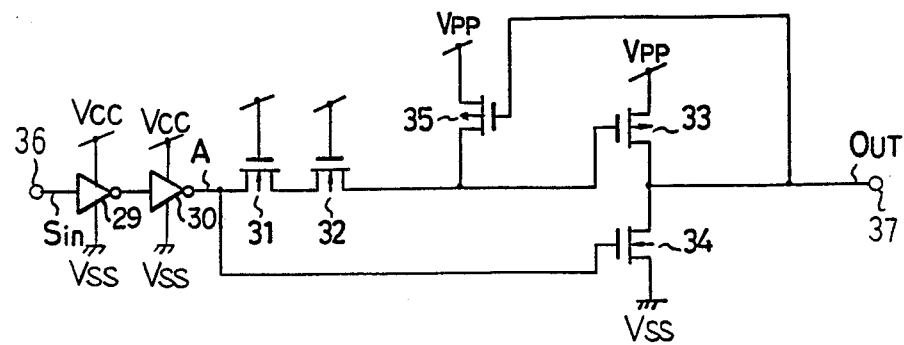
FIG. 3 is a circuit diagram of another conventional voltage circuit diagram.

Thus, when the voltage level converting circuit of this invention is applied to an EPROM of FIG. 1, the application of a surge voltage to the memory cell is prevented. Therefore, the unintentional write or release of the stored date is prevented, and the reliability of the device is increased.

The present invention has been described with respect to a specific embodiment. However, other embodiments based on the principles of the present invention should be obvious to those of ordinary skill in the art. Such embodiments are intended to be covered by the claims.

What is claimed is:

1. A voltage level converting circuit which receives an input logic signal of either a "one" or "zero" level, wherein the logic "one" signal is represented by a first voltage level, and outputs an output logic signal as either a "zero" output signal or a "one" output signal, respectively, wherein the "one" output signal is represented by a second voltage level higher than said first voltage level, comprising:
   gate means for receiving and transferring the input signal;
   an output on which the output signal is provided;
   inverter means biased with a voltage of said second voltage level for receiving the input signal from said gate means and for outputting the output signal responsive to the input signal;
   pull-up means responsive to the "zero" output signal for raising the voltage level of the input signal to the inverter means; and
   pull-down means coupled to the output and responsive to a "one" input signal for lowering the voltage level of the output signal.

2. The voltage level converting circuit of claim 1, wherein the inverter means includes a CMOS inverter circuit having an input supplied with the input signal, and is coupled to the output for outputting the output signal.

3. The voltage level converting circuit of claim 2, wherein the gate means includes first and second MOS transistors of a first conductivity type, each having a source and drain path serially connected between the input of said voltage level converting circuit and the input of the CMOS inverter circuit.

4. A voltage level converting circuit which receives an input logic signal of either a 37 one" or "zero" level, wherein the logic "one" signal is represented by a first voltage level, and outputs an output logic signal as either a "zero" output signal or a "one" output signal, respectively, wherein the "one" output signal is represented by a second voltage level higher than said first voltage level, comprising:
   gate means for receiving and transferring the input signal;
   an output on which the output signal is provided;
   inverter means biased with a voltage of said second voltage level for receiving the input signal from said gate means and for outputting the output signal responsive to the input signal, the inverter means including a CMOS inverter circuit having an input supplied with the input signal, and coupled to the output for outputting the output signal;
   pull-up means responsive to the "zero" output signal for raising the voltage level of the input signal to the inverter means, the pull-up means including a MOS transistor of a second conductivity type having a gate electrode supplied with the output signal; and
   pull-down means coupled to the output and responsive to a "one" input signal for lowering the voltage level of the output signal, the pull-down means including a MOS transistor of said first conductivity type having a gate electrode supplied with the input signal.

5. A voltage level converting circuit which receives an input logic signal of either a "one" or "zero" level, wherein the logic "one" signal is represented by a first voltage level, and outputs an output logic signal as either a "zero" output signal or a "one" output signal, respectively, wherein the "one" output signal is represented by a second voltage level higher than said first voltage level, comprising:
   gate means for receiving and transferring the input signal;
   an output on which the output signal is provided;
   inverter means biased with a voltage of said second voltage level for receiving the input signal from said gate means and for outputting the output signal responsive to the input signal, the inverter means including a CMOS inverter circuit having an input supplied with the input signal, and coupled to the output for outputting the output signal;

pull-up means responsive to the "zero" output signal for raising the voltage level of the input signal to the inverter means, the pull-up means including a MOS transistor of a second conductivity type having a gate electrode supplied with the output signal;
pull-down means coupled to the output and responsive to a "one" input signal for lowering the voltage level of the output signal, the pull-down means including a MOS transistor of said first conductivity type having a gate electrode supplied with the input signal; and
wherein the pull-up means further comprises a capacitor for coupling the input of the CMOS inverter circuit to a voltage of the first voltage level.

6. A voltage level converting circuit which receives an input logic signal of either a "one" or "zero" level, wherein the logic "one" signal is represented by a first voltage level, and outputs an output logic signal as either a "zero" output signal or a "one" output signal, respectively, wherein the "one" output signal is represented by a second voltage level higher than said first voltage level, comprising:

gate means for receiving and transferring the input signal, the gate means including first and second MOS transistors of a first conductivity type, each having a source and drain path serially connected between the input of said voltage level converting circuit and the input of the CMOS inverter circuit;

an output on which the output signal is provided;

inverter means biased with a voltage of said second voltage level for receiving the input signal from said gate means and for outputting the output signal responsive to the input signal, the inverter means including a CMOS inverter circuit having an input supplied with the input signal, and being coupled to the output for outputting the output signal;

pull-up means responsive to the "zero" output signal for raising the voltage level of the input signal to the inverter means; and

* * * * *

UNITED STATES PATENT AND TRADEMARK OFFICE
CERTIFICATE OF CORRECTION

PATENT NO. : 4,926,070
DATED : May 15, 1990
INVENTOR(S) : Sumio Tanaka et al.

It is certified that error appears in the above-identified patent and that said Letters Patent is hereby corrected as shown below:

Claim 4, line 21, and column 6, change "37" to --"--.

Claim 6, line 21, and column 8, after "and" insert --pull-down means coupled to the output and responsive to a "one" input signal for lowering the voltage level of the output signal, the pull-down means including a capacitor for coupling the output of the CMOS inverter circuit to ground.--

Signed and Sealed this

Sixth Day of October, 1992

Attest:

DOUGLAS B. COMER

Attesting Officer     Acting Commissioner of Patents and Trademarks